United States Patent [19]
Chern et al.

[11] Patent Number: 5,136,190
[45] Date of Patent: Aug. 4, 1992

[54] CMOS VOLTAGE LEVEL TRANSLATOR CIRCUIT

[75] Inventors: Wen-Foo Chern; Kul B. Ohri, both of Boise, Id.

[73] Assignee: Micron Technology, Inc., Boise, Id.

[21] Appl. No.: 742,246

[22] Filed: Aug. 7, 1991

[51] Int. Cl.[5] .................. H03K 19/0175; H03K 3/29; H03K 19/094; H03L 5/00
[52] U.S. Cl. .................... 307/475; 307/291; 307/451; 307/264; 307/585
[58] Field of Search ............... 307/475, 451, 290, 291, 307/272.1, 264, 574, 577, 585

[56] References Cited

U.S. PATENT DOCUMENTS

| | | | |
|---|---|---|---|
| 4,958,091 | 9/1990 | Roberts | 307/451 |
| 4,978,870 | 12/1990 | Chen et al. | 307/475 |
| 4,996,443 | 2/1991 | Tateno | 307/475 |

OTHER PUBLICATIONS

"An Experimental 4-Mb Flash EEPROM with Sector Erase" IEEE Journal of Solid State Circuits, vol. 26, No. 4, Apr. 1991, pp. 484-491.

Primary Examiner—Stanley D. Miller
Assistant Examiner—Trong Phan
Attorney, Agent, or Firm—David J. Paul

[57] ABSTRACT

An improved CMOS voltage level translator circuit having an interface stage, an intermediate stage and an output stage is presented. The inventive circuit is characterized by low crossover current in the output and intermediate stages while maintaining minimal delay response when translating a lower potential signal into a higher potential signal. The improved translator circuit may be used in applications such as during EEPROM programming where control signals with normal voltage TTL voltage swing of $V_{CC}$ and $V_{SS}$ need to interface with the EEPROM row decoders which require a much higher voltage swing of $V_{CC}'$ (>V hd CC) and $V_{SS}$.

22 Claims, 8 Drawing Sheets

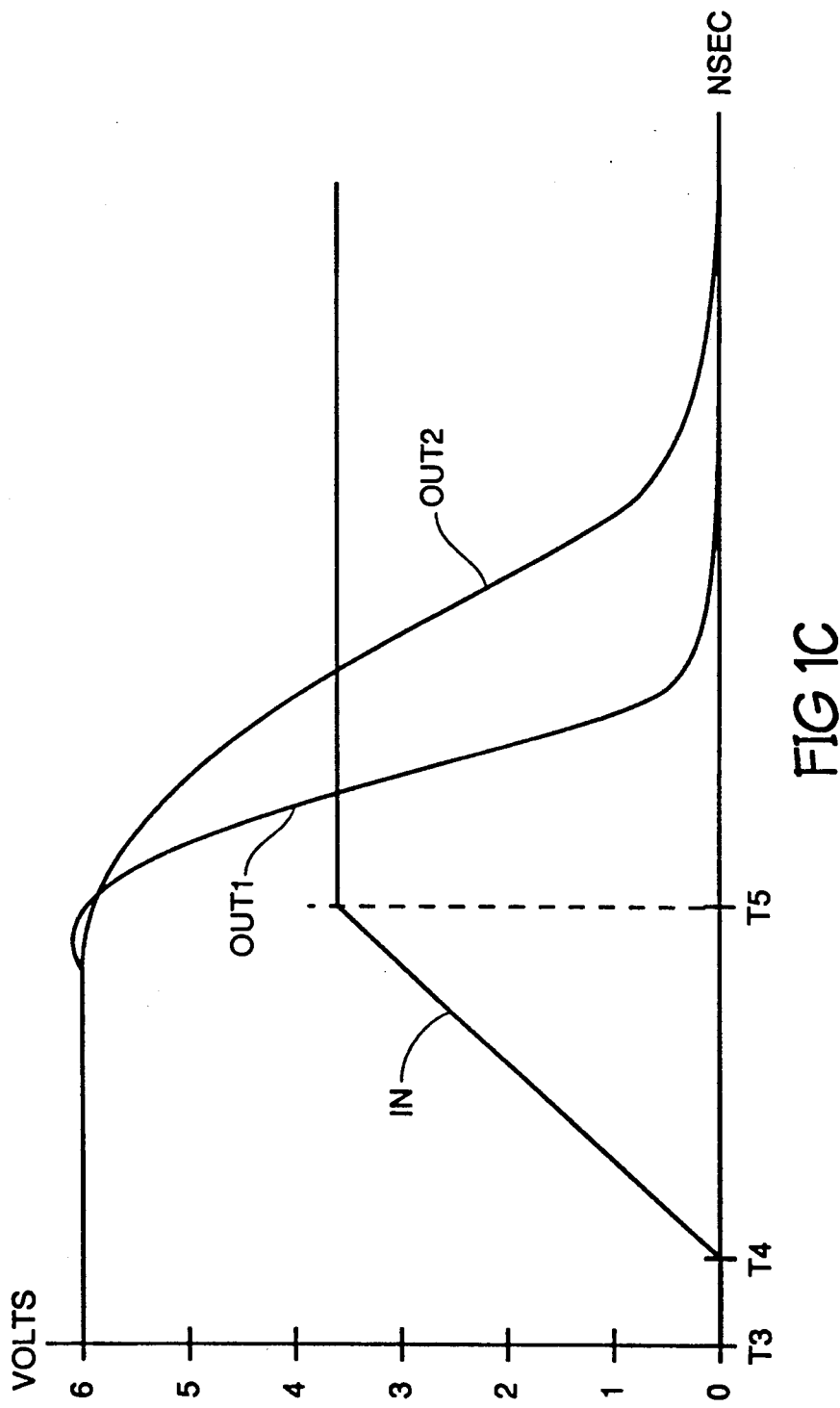

CMOS VOLTAGE LEVEL TRANSLATOR CIRCUIT

FIELD OF THE INVENTION

This invention relates to a CMOS voltage level translator circuit formed in a semiconductor integrated circuit (IC) and in particular a circuit that may be used in various memory devices, such as dynamic random access memories (DRAMs) or erasable programmable read only memory families (EPROMs, EEPROMs, etc.).

BACKGROUND OF THE INVENTION

There are many instances on advanced ICs where voltage level translator circuits are needed to interface between circuit blocks with different power supplies, such as on DRAMs, EPROMS, EEPROMs, etc., where control signals with a normal swing (i.e. 5 V) between $V_{CC}$ and $V_{SS}$ need to interface with row decoders which have a much higher voltage swing of $V_{CC}'$ (where $V_{CC}'$ is $>V_{CC}$) and $V_{SS}$ during cell programming.

Also, in order to maintain device reliability for future IC generations with sub-micron devices having a feature size smaller than 0.6 μ, these devices will be required to operate under a supply voltage of <4 V. Yet, voltage level translators may still be required to interface with circuit blocks having a supply voltage of >4 V that is generated either internally or externally, for device performance enhancement.

Thus, it will become very important to have a voltage level translator with minimum propagation delay for maximum speed, as well as one with minimal power dissipation, in order to promote long term operating reliability while providing optimum circuit performance.

In FIG. 1a, a CMOS Voltage Converter described in U.S. Pat. No. 4,958,091, by Gregory N. Roberts, is shown. In addition, FIGS. 1b and 1c diagram a computer simulation of the circuit action of FIG. 1a in comparison with computer simulations of the present invention which is shown in FIG. 3a. The output of the present invention (FIG. 3a) is labeled OUT1 and the output of FIG. 1a is labeled OUT2.

As can be seen from the circuit simulation of FIG. 1b, for an input with a high to low transition, the propagation delay for both circuits is essentially the same. However, during a low to high transition, shown in FIG. 1c, the circuit of the present invention is considerably faster. The speed of the present invention is attributed to node C being able to rise fully to $V_{CCR}$, thus allowing $Q_{11}$ to fully turn on while partially turning off $Q_9$, which allows the present invention to discharge the output faster. The lack of discharge speed in FIG. 1a, is due to series transmission gate, Q5, between nodes E and F that allow node F to only rise to $V_{CCR}-V_t$ initially, thus causing a weaker turn on of $Q_{11}$. Due to the weak turn on of $Q_{11}$ and $Q_9$ always being fully on instead of partially off, as well as a weaker turn off of $Q_8$, the output is discharged at a slower rate which also causes a considerably higher crossing current at the output stage, as compared to a lower crossing current of the present invention.

A high-voltage translator circuit disclosed in an article submitted by McConnell et. al., entitled "An Experimental 4-Mb Flash EEPROM with Sector Erase," IEEE JOURNAL OF SOLID-STATE CIRCUITS, VOL. 26, NO. 4, pp. 484-491, APRIL 1991, has been reproduced in FIG. 2a in order to show computer simulation comparisons between this circuit and the present invention.

As can be seen from the circuit simulation of FIG. 2b, the power dissipated for the circuit of FIG. 2a, represented by curve VCCP2, is substantially higher than the power dissipated by that of the present invention, represented by curve VCCP1, during a high to low transition. This difference in power dissipation is due to the intercoupling employed in the present invention versus that of FIG. 2a. By connecting the gate of $Q_6$ to the input of the inverter stage and the gate of $Q_9$ to node C in the present invention, versus having these gates grounded, as in FIG. 2a, the crossing current is reduced, thereby reducing the power dissipated by the present invention as compared to the power dissipated by the circuit of FIG. 2a. The low crossing current of the present invention is due to the partial turning off of p-channel transistors $Q_6$ and $Q_9$ versus being always fully on during transition, as in the circuit of FIG. 2a.

SUMMARY OF THE INVENTION

The voltage level translator circuit of the present invention is an improvement to the circuit of FIG. 2a. The voltage level translator provides the interface between circuit blocks with different power supplies where control signals with a normal swing (i.e. 5 V) between $V_{CC}$ and $V_{SS}$ need to interface with other circuitry (i.e. row decoders) which have a much higher voltage swing of $V_{CC}'$ (where $V_{CC}'$ is $>V_{CC}$) and $V_{SS}$ during operation.

In order to maintain device reliability for future IC generations with sub-micron devices, the present invention allows a device to operate under a supply voltage of <4 V, while at the same time provides the interface to circuit blocks having a supply voltage of >4 V that may be generated either internally or externally.

The present invention's improvement on the circuitry of FIG. 2a, not only maintains excellent speed operation but also has the significantly added benefit of low power dissipation, which in turn increases long term circuit reliability when implemented in semiconductor devices of various applications.

BRIEF DESCRIPTION OF THE DRAWINGS

FIG. 1c is a computer simulation of the operation of the present invention (shown in FIG. 3a) when the input transitions from a low to a high voltage;

FIG. 3a depicts the preferred embodiment of a voltage level translator which is an improvement over the circuit of FIG. 2a;

DETAILED DESCRIPTION OF THE PREFERRED EMBODIMENT

Figure 3A:
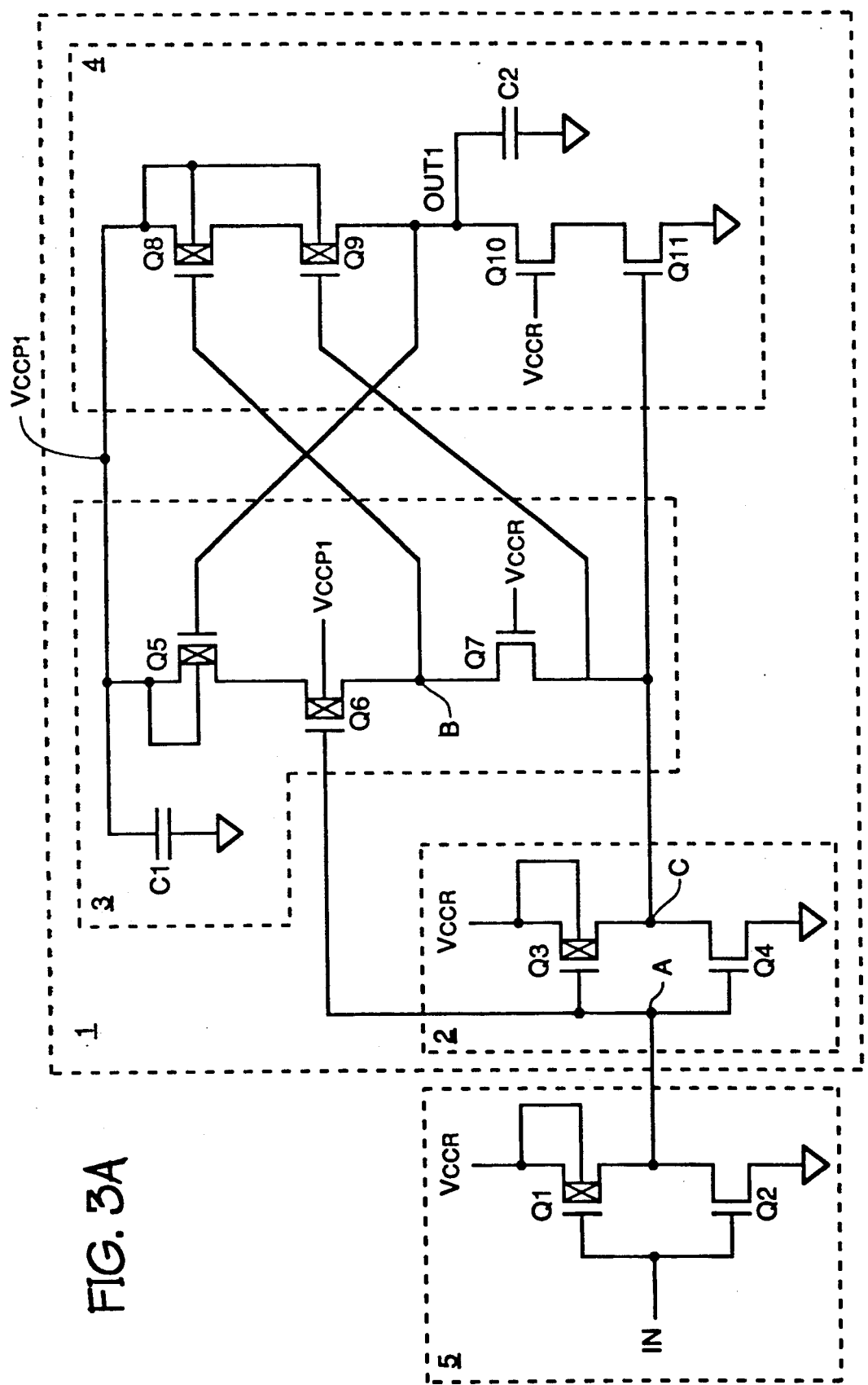

FIG. 3a, gives a schematic representation for the preferred embodiment of the present invention of an improved voltage level translator 1, comprising an input interface stage 2, an intermediate stage 3 and an output stage 4. Although not part of the invention, a typical input inverter stage 5 is shown coupled to interface stage 2.

Figure 1A:
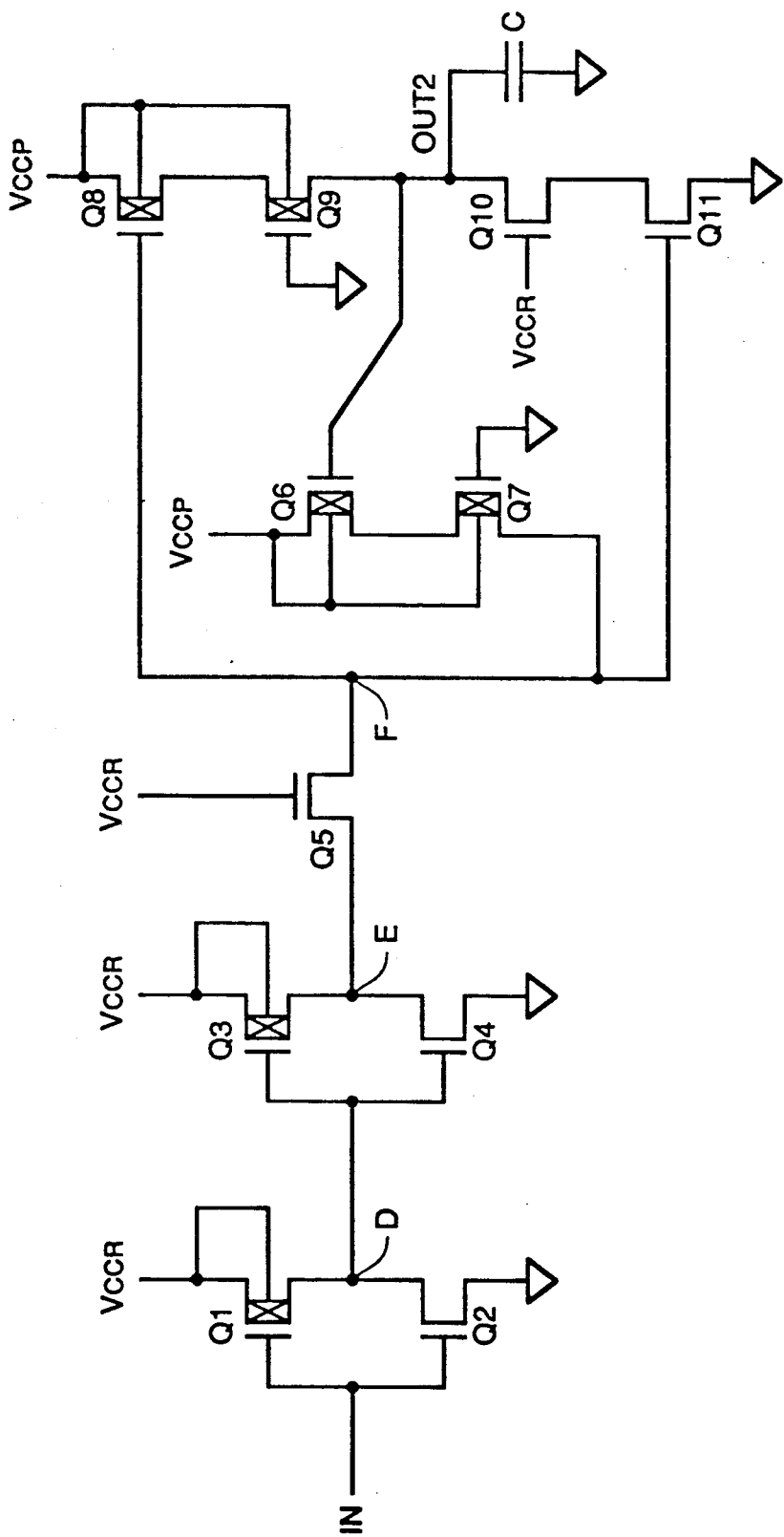
FIG. 1a is a schematic of a CMOS voltage converter, which may be viewed as related art.
Figure 1B:
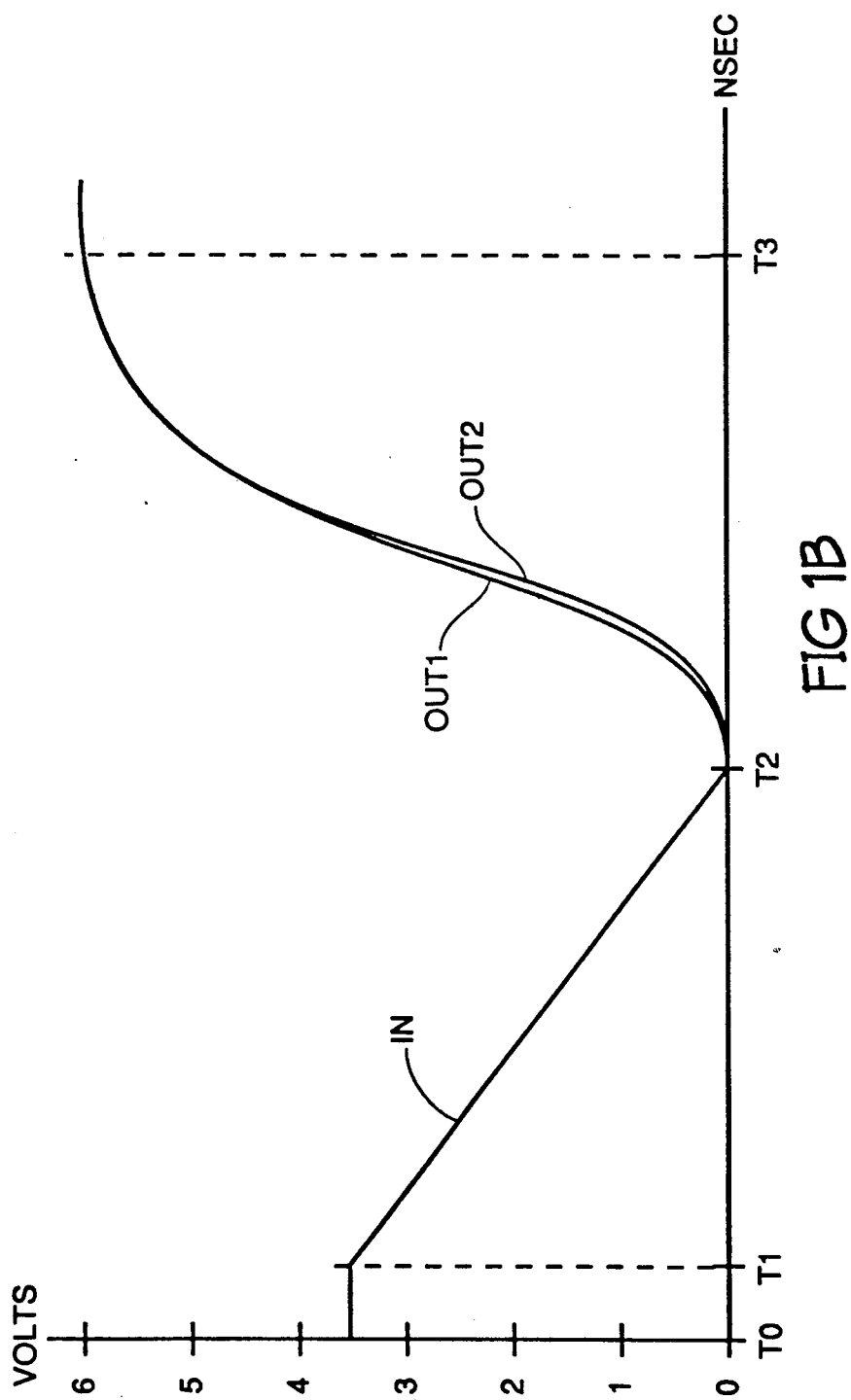
FIG. 1b is a computer simulation comparing the circuit response of FIG. 1a to the present invention (shown in FIG. 3a) when the input transitions from a high to a low voltage.
Figure 2A:
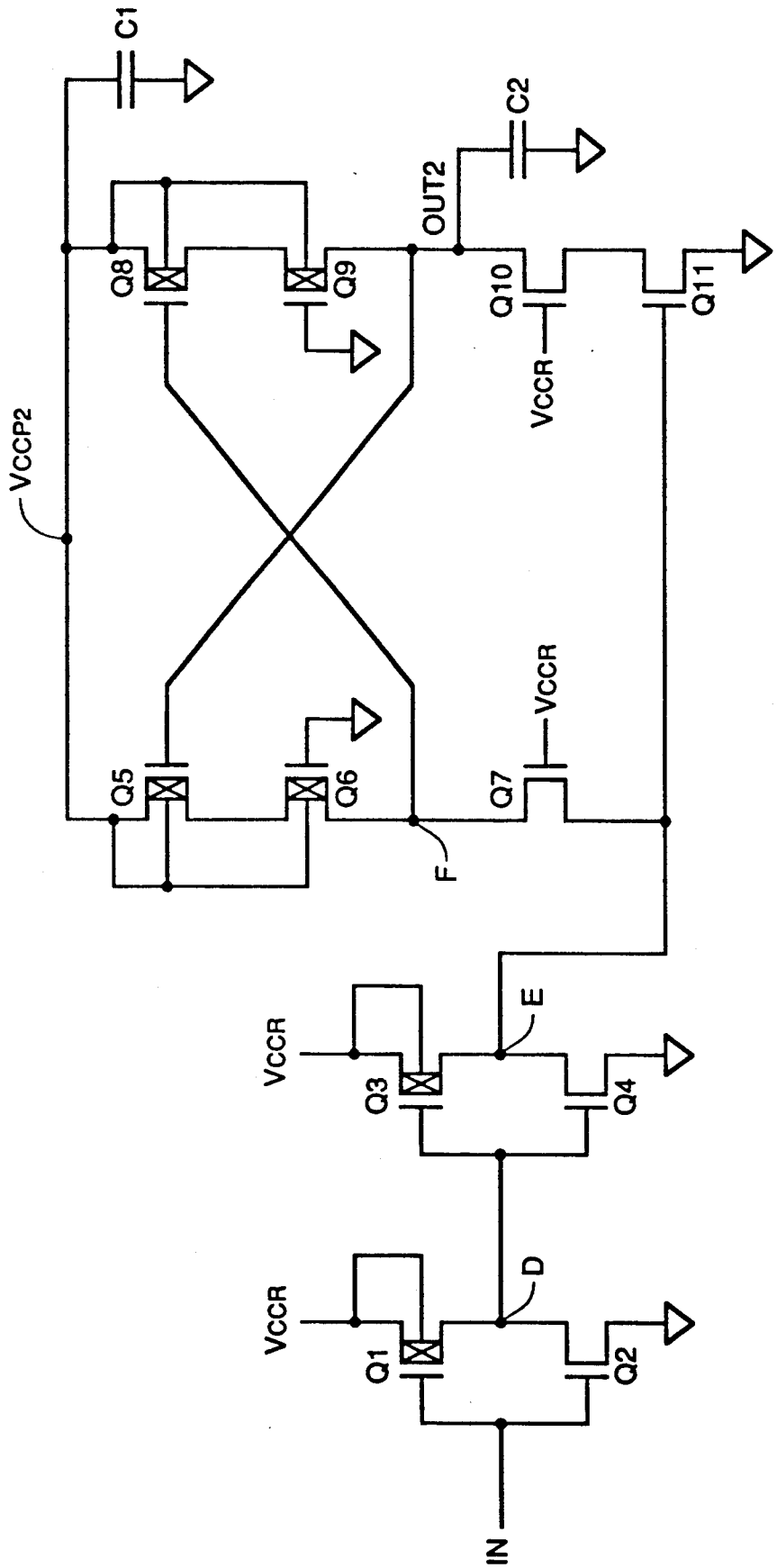
FIG. 2a is a reproduced schematic of a high-voltage translator circuit which may be viewed as relevant art to the present invention.
Figure 2B:
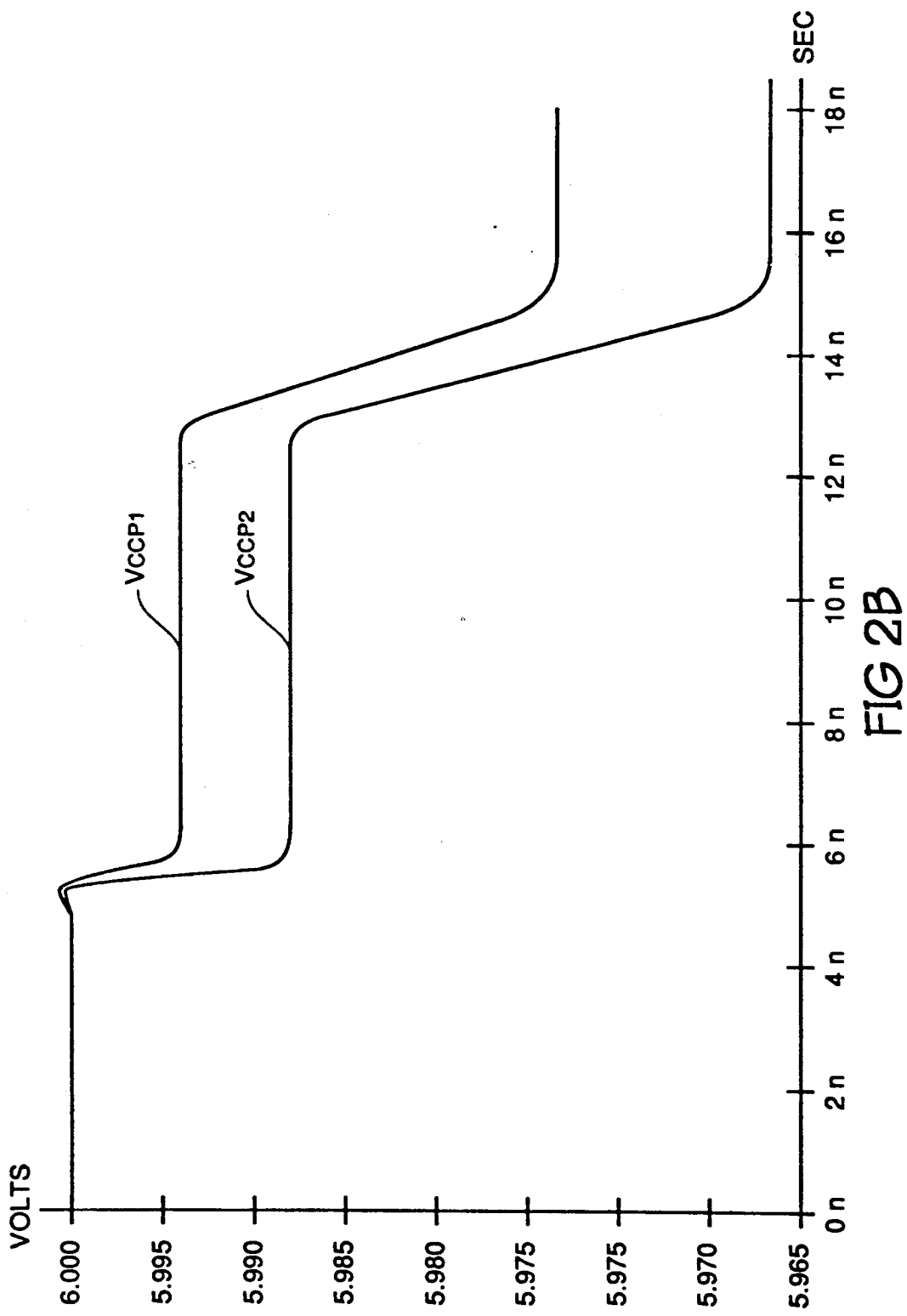
FIG. 2b is a computer simulation comparing the circuit power dissipation of FIG. 2a to the present invention (shown in FIG. 3a) as the input signal transitions from a low to a high voltage and high to low voltage.

Input stage 5 and capacitors $C_1$ and $C_2$ are present in order to produce the computer simulations of FIGS. 1b, 1c and 2b and should not be construed as being necessary components of the present invention. Therefore, attention is directed mainly towards voltage level translator 1 (or simply translator 1) presented in the following description.

Interface stage 2 is comprised of a CMOS inverter, formed from PMOS transistor Q3 and NMOS transistor Q4. The sources of Q3 and Q4 are coupled in typical series fashion between voltage potentials $V_{CCR}$ and $V_{SS}$, respectively, with their gates being coupled together, thereby functioning as the input node of level translator 1. The drains of Q3 and Q4 are then coupled together at node C to provide an inverted output at the necessary nodes in level translator 1.

Intermediate stage 3 is comprised of PMOS transistors Q5 and Q6 and NMOS transistor Q7 all coupled in series. Q5 is coupled between supply voltage $V_{CCP1}$ and the source of Q6 at its source and drain, respectively, while the drain of Q6 and the drain of Q7 couple together at node B to provide an input coupled to the gate of Q8 in output stage 4. The gate of Q6 couples to the input node of the inverter stage 2. Q7's source couples to node C, while its gate couples to $V_{CCR}$.

Figure 3B:
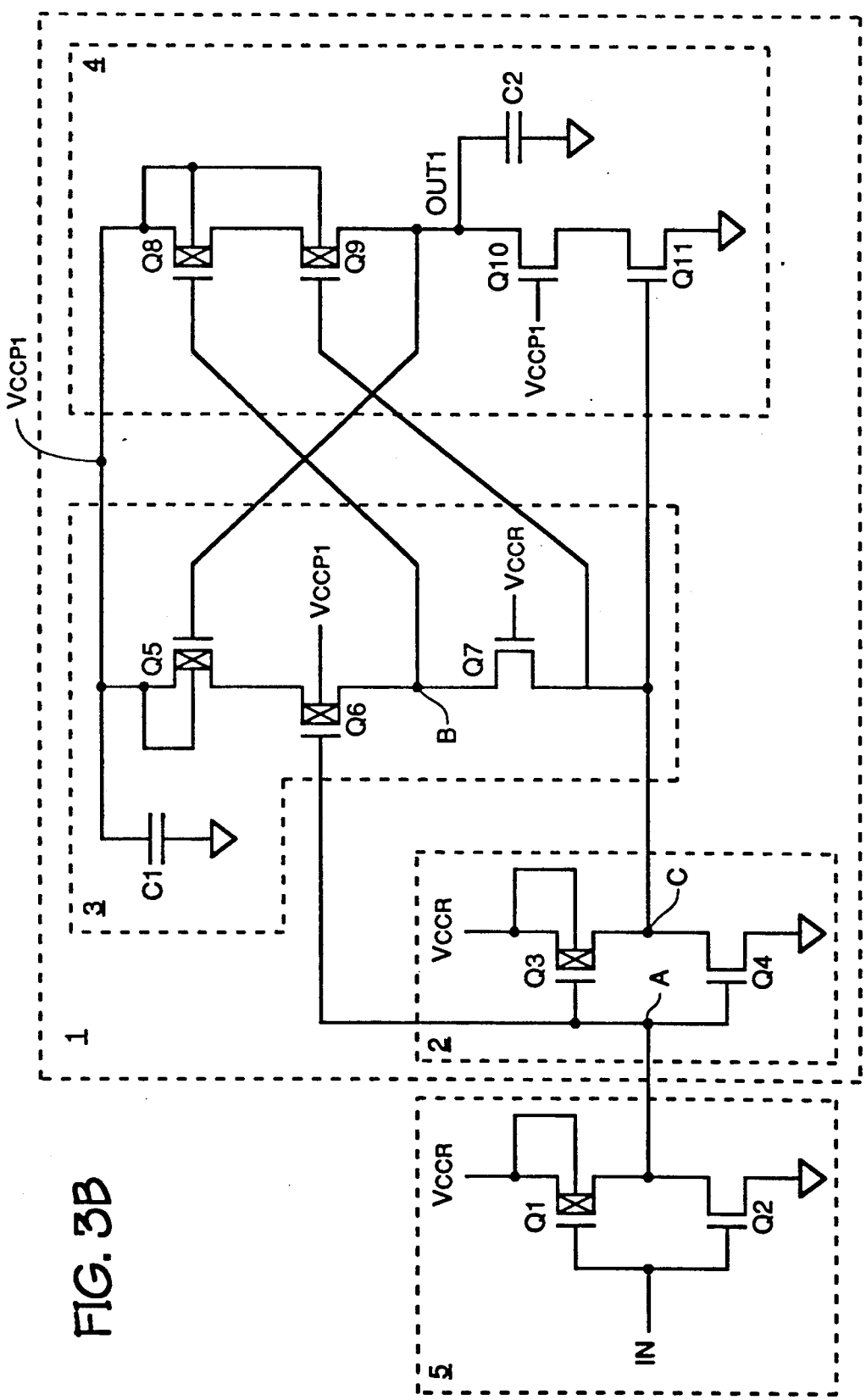
FIG. 3b depicts a second embodiment of a voltage level translator circuit of the present invention.
Figure 4:
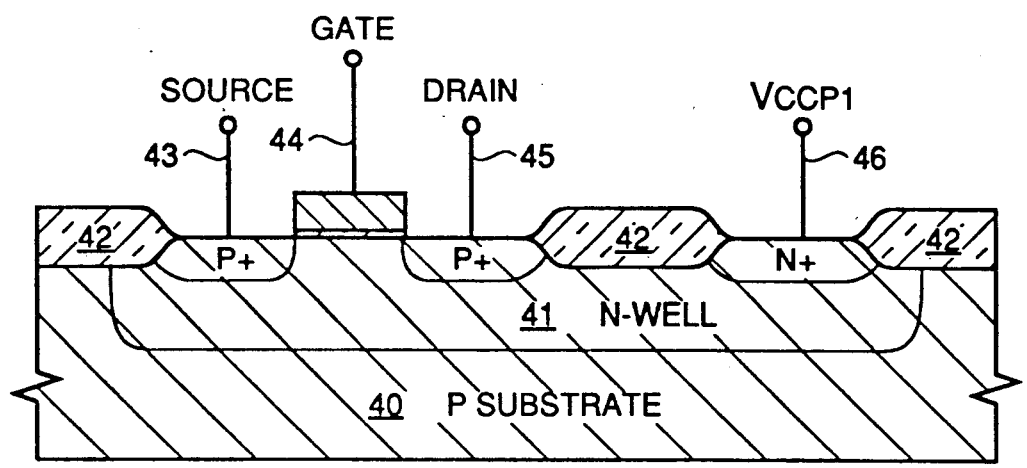
FIG. 4 is a cross-sectional view of a PMOS transistor which may be used in the present invention.

Output stage 4 is comprised of a series coupled network of drive PMOS transistors Q8 and Q9 and NMOS transistors Q10 and Q11. The source of Q8 couples to potential $V_{CCP1}$ while its drain couples to the source of Q9. Q9's drain couples with the drain of Q10 at node OUT1 to provide output drive to external circuitry desired by one skilled in the art to work in conjunction with level translator 1. OUT1 is also coupled back to the gate of Q5 of intermediate stage 3. The source of Q10 couples to the drain of Q11, the gate of Q10 couples to either potential $V_{CCR}$ or $V_{CCP1}$ (as shown in FIG. 3b) and the source of Q11 couples to potential $V_{SS}$. The gates of Q9 and Q11 couple to node C. To complete the intercoupling of translator 1, as shown in FIG. 4, n-well 41, formed in p-substrate 40, is connected to $V_{CCP1}$ at node 46 to provide the proper back bias to all PMOS transistors in intermediate stage 3 and output stage 4.

For a general understanding of circuit operation assume for sake of illustration that the threshold voltage (vt.) for all n-channel devices is approximately equal to 0.8 V and −0.8 V for all p-channel devices (typical threshold voltages range from 0.6 V to 1.2 V). Further assume that series transistors in their respective stages are matched. Further assume that $V_{CCR}$ is 3.6 V, $V_{CCP1}$ is 6.0 V and $V_{SS}$ is 0 V in an ideal state. Representative cases of an input signal transitioning from a high (3.6 V for sake of illustration) to a low (0 V) and from a low to a high are discussed.

The significance of several of the intercouplings, which are the main focus of the present invention, will be brought to light in the following circuit operation discussion.

High to Low Input Transitions

In this discussion, refer to FIG. 1b and assume OUT1 is initially at 0 V and inverter stage 1 is used to receive input signal IN. As FIG. 1b shows, the circuit is in a steady state at $T_0$ with an input signal at 3.6 V. At $T_1$, IN begins to transition from its 3.6 V level and reaches $V_{SS}$ at $T_2$. The output of inverter stage 1 follows IN and provides IN' (node A) to the gates of Q3, Q4 and Q6. As IN' transitions from 0 V to 3.6 V, Q3 turns off and the threshold voltage of Q4 is overcome thereby, causing Q4 to turn on thereby pulling node C down to 0 V. At the same time IN' is presented to the gate of Q6 causing it to turn partially off. This coupling of IN' to the gate of Q6 is one of significance as the partially turning off of Q6 reduces the crossing current of intermediate stage 3. The presence of 0 V on node C causes Q11 to turn off and Q9 to turn on. Because the gate of Q7 is held at 3.6 V, Q7 conducts and transfers 0 V to the gate of Q8 which causes Q8 to conduct. A current path is now established from the 6.0 V supply to OUT1 thus driving OUT1 to 6 V at $T_3$, thereby translating the lower 3.6 V incoming signal to a higher signal of 6 V which is required by the external circuitry.

Low to High Input Transitions

Referring to FIG. 1c, OUT1 is now at 6 V (at $T_3$) and inverter stage 1 is still in place to receive input signal IN for this discussion. The circuit is in a steady state at $T_3$ with an input signal at 0 V. At $T_4$, IN begins to transition from its 0 V level and reaches 3.6 V at $T_5$. The output of inverter stage 1 follows IN and provides IN' to the gates of Q3, Q4 and Q6. As IN' transitions from 3.6 V to 0 V, Q4 turns off and the threshold voltage of Q3 is overcome thereby, causing Q3 to turn on and drive node C to 3.6 V. At the same time, Q6 is biased on and will only provide current to node B when Q5 turns on. Because the gate of Q7 is held at 3.6 V, Q7 conducts and drives node B to 3.6 V−vt. which causes Q8 to turn partially off. The presence of 3.6 V on node C causes Q9 to turn partially off and Q11 to turn on. With the gate of Q10 held at 3.6 V a current path is now established between drive transistors Q10 and Q11 from the 0 V supply to OUT1 thus driving OUT1 to 0 V at $T_6$.

By connecting the gate of Q9 to node C, the switching current between the PMOS output drivers (Q8 and Q9) and NMOS output drivers (Q10 and Q11) is minimized, while circuit response time is maintained. This connection is one of the significant improvements of the present invention.

Sizing selected for PMOS and NMOS transistors should be such that sufficient drive is provided to OUT1 for a specific load, whether the output is a high or a low.

It is to be understood that although the present invention has been described with reference to a preferred embodiment, various modifications (such as NMOS and PMOS transistor ratios and sizing, varying circuit operating potentials or even developing a bipolar transistor version) known to those skilled in the art, may be made to the circuit presented herein without departing from the invention as recited in the several claims appended hereto.

We claim:

1. A circuit to translate a lower potential signal into a higher potential signal, said circuit comprising:

first, second and third potential sources;

an inverter comprising first and second transistors, each transistor having an input terminal and first and second terminals, said first and second transistors having said input terminals coupled together and said second terminal of said first transistor coupled to said first terminal of said second transistor, said first transistor having its first terminal coupled to said first potential source, said second transistor having its second terminal coupled to said second potential source;

an output stage comprising first, second, third and fourth transistors coupled in series fashion, each transistor having an input terminal and first and second terminals, said first transistor's first terminal coupled to said third potential source and its second terminal coupled to said first terminal of said second transistor, said second transistor's second terminal coupled to said first terminal of said third transistor thereby providing an output node, said third transistor having its second terminal coupled to said first terminal of said fourth transistor and its input terminal coupled to said first potential source, said fourth transistor having its second terminal coupled to said second potential source; and an intermediate stage comprising first, second and third transistors coupled in series fashion, each transistor having an input terminal and first and second terminals, said first transistor having its first terminal coupled to said third potential source, its second terminal coupled to said first terminal of said second transistor and its input terminal coupled to said output node, said second transistor having its second terminal coupled to said first terminal of said third transistor and to said input terminal of said first output stage transistor and its input terminal coupled to said input terminals of said first and second inverter stage transistors, said third transistor having its second terminal coupled to said input terminals of said second and fourth output stage transistors, to said second terminal of said first inverter stage transistor and to said first terminal of said second inverter stage transistor, said third transistor having its input terminal coupled to said first potential source.

2. The circuit as recited in claim 1, wherein said first potential source is less than said third potential source and said first and third potential sources are greater than said second potential source.

3. The circuit as recited in claim 1, wherein said first inverter stage transistor, said first and second output stage transistors, and said first and second intermediate stage transistors are PMOS transistors, said second inverter stage transistor, said third and fourth output stage transistors, and said third intermediate stage transistor are NMOS transistors.

4. The circuit as recited in claim 3, wherein said PMOS transistors are formed in an N-well doped substrate, said N-well couples to said third potential source.

5. A circuit as recited in claim 1, wherein said circuit is fabricated using CMOS technology.

6. A CMOS voltage level translator circuit fabricated into a semiconductor device to translate a lower potential signal into a higher potential signal, said circuit comprising:

first, second and third potential sources;

a CMOS inverter comprising a PMOS transistor and an NMOS transistor having their gates coupled together and their drains coupled together, said PMOS transistor having its source coupled to said first potential source, said NMOS transistor having its source coupled to said second potential source;

a CMOS output stage comprising first and second PMOS transistors and first and second NMOS transistors all coupled in series, said first PMOS transistor's drain coupled to the source of said second PMOS transistor with the source of said first PMOS transistor coupled to said third potential source and the drain of said second PMOS transistor coupled to an output node, said first NMOS transistor's source coupled to the drain of said second NMOS transistor, with the drain of said first NMOS transistor coupled to said output node, its gate coupled to said first potential source, and the source of said second NMOS transistor coupled to said second potential source; and a CMOS intermediate stage comprising an NMOS transistor and first and second PMOS transistors all coupled in series, said NMOS transistor having its source coupled to the drains of said CMOS inverter transistors and to the gates of said second NMOS and said second PMOS transistors of said output stage, the gate of said intermediate NMOS transistor coupled to said first potential source, said second intermediate PMOS transistor having its drain coupled to the drain of said intermediate NMOS transistor and to the gate of said first PMOS transistor of said output stage, said second intermediate PMOS transistor having its gate coupled to the coupled input gates of said CMOS inverter and its source coupled to the drain of said first intermediate PMOS transistor, said first intermediate PMOS transistor having its source coupled to said third potential source and its gate coupled to said output node of said output stage.

7. The circuit as recited in claim 8, wherein said first potential source is less than said third potential source and said first and third potential sources are greater than said second potential source.

8. The circuit as recited in claim 6, wherein said PMOS transistors are formed in an N-well doped substrate, said N-well couples to said third potential source.

9. A circuit as recited in claim 6, wherein said gate couplings of said second intermediate PMOS transistor and said second output PMOS transistor provide a reduced switching current during circuit operation.

10. A circuit as recited in claim 6, wherein said semiconductor device is an integrated circuit.

11. A circuit as recited in claim 6, wherein said semiconductor device includes DRAMs, EPROMs and EEPROMs.

12. A circuit to translate a lower potential signal into a higher potential signal, said circuit comprising:

first, second and third potential sources;

an inverter comprising first and second transistors, each transistor having an input terminal and first and second terminals, said first and second transistors having said input terminals coupled together and said second terminal of said first transistor coupled to said first terminal of said second transistor, said first transistor having its first terminal coupled to said first potential source, said second transistor having its second terminal coupled to said second potential source;

an output stage comprising first, second, third and forth transistors coupled in series fashion, each transistor having an input terminal and first and second terminals, said first transistor's first terminal coupled to said third potential source and its second terminal coupled to said first terminal of said second transistor, said second transistor's second terminal coupled to said first terminal of said third transistor thereby providing an output node, said third transistor having its second terminal coupled to said first terminal of said fourth transistor and its input terminal coupled to said third potential source, said fourth transistor having its second terminal coupled to said second potential source; and an intermediate stage comprising first, second and third transistors coupled in series fashion, each transistor having an input terminal and first and second terminals, said first transistor having its first terminal coupled to said third potential source, its second terminal coupled to said first terminal of said second transistor and its input terminal coupled to said output node, said second transistor having its second terminal coupled to said first terminal of said third transistor and to said input terminal of said first output stage transistor and its input terminal coupled to said input terminals of said first and second inverter stage transistors, said third transistor having its second terminal coupled to said input terminals of said second and fourth output stage transistors, to said second terminal of said first inverter stage transistor and to said first terminal of said second inverter stage transistor, said third transistor having its input terminal coupled to said first potential source.

13. The circuit as recited in claim 12, wherein said first potential source is less than said third potential source and said first and third potential sources are greater than said second potential source.

14. The circuit as recited in claim 12, wherein said first inverter stage transistor, said first and second output stage transistors, and said first and second intermediate stage transistors are PMOS transistors, said second inverter stage transistor, said third and fourth output stage transistors, and said third intermediate stage transistor are NMOS transistors.

15. The circuit as recited in claim 14, wherein said PMOS transistors are formed in an N-well doped substrate, said N-well coupled to said third potential source.

16. A circuit as recited in claim 12, wherein said circuit is fabricated using CMOS technology.

17. A CMOS voltage level translator circuit fabricated into a semiconductor device to translate a lower potential signal into a higher potential signal, said circuit comprising:

first, second and third potential sources;

a CMOS inverter comprising a PMOS transistor and an NMOS transistor having their gates coupled together and their drains coupled together, said PMOS transistor having its source coupled to said first potential source, said NMOS transistor having its source coupled to said second potential source;

a CMOS output stage comprising first and second PMOS transistors and first and second NMOS transistors all coupled in series, said first PMOS transistor's drain coupled to the source of said second PMOS transistor with the source of said first PMOS transistor coupled to said third potential source and the drain of said second PMOS transistor coupled to an output node, said first NMOS transistor's source coupled to the drain of said second NMOS transistor, with the drain of said first NMOS transistor coupled to said output node, its gate coupled to said third potential source, and the source of said second NMOS transistor coupled to said second potential source; and a CMOS intermediate stage comprising an NMOS transistor and first and second PMOS transistors all coupled in series, said NMOS transistor having its source coupled to the drains of said CMOS inverter transistors and to the gates of said second NMOS and said second PMOS transistors of said output stage, the gate of said intermediate NMOS transistor coupled to said first potential source, said second intermediate PMOS transistor having its drain coupled to the drain of said intermediate NMOS transistor and to the gate of said first PMOS transistor of said output stage, said second intermediate PMOS transistor having its gate coupled to the coupled input gates of said CMOS inverter and its source coupled to the drain of said first intermediate PMOS transistor, said first intermediate PMOS transistor having its source coupled to said third potential source and its gate coupled to said output node of said output stage.

18. The circuit as recited in claim 17, wherein said first potential source is less than said third potential source and said first and third potential sources are greater than said second potential source.

19. The circuit as recited in claim 17, wherein said PMOS transistors are formed in an N-well doped substrate, said N-well coupled to said third potential source.

20. A circuit as recited in claim 17, wherein said gate couplings of said second intermediate PMOS transistor and said second output PMOS transistor provide a reduced switching current during circuit operation.

21. A circuit as recited in claim 17, wherein said semiconductor device is an integrated circuit.

22. A circuit as recited in claim 17, wherein said semiconductor device includes DRAMs, EPROMs and EEPROMs.

* * * * *

UNITED STATES PATENT AND TRADEMARK OFFICE
CERTIFICATE OF CORRECTION

PATENT NO. : 5,136,190
DATED : August 4, 1992
INVENTOR(S) : David J. Paul

It is certified that error appears in the above-indentified patent and that said Letters Patent is hereby corrected as shown below:

In the Abstract, line 12, kindly delete "(>V hd CC)" and insert -- $(>V_{cc})$ --.

Column 2, line 60, kindly delete "3adepicts" and insert -- 3a depicts --.

Column 6, line 38, kindly delete "8" and insert -- 6 --.

Signed and Sealed this

Twenty-fifth Day of January, 1994

Attest:

BRUCE LEHMAN

*Attesting Officer*  *Commissioner of Patents and Trademarks*